United States Patent [19]

Streckenbach

[11] 4,290,029
[45] Sep. 15, 1981

[54] DIGITAL PHASE CONTROL CIRCUIT INCLUDING AN AUXILIARY CIRCUIT

[75] Inventor: Wulf-Christian Streckenbach, Hemmingen, Fed. Rep. of Germany

[73] Assignee: Licentia Patent-Verwaltungs-G.m.b.H., Frankfurt am Main, Fed. Rep. of Germany

[21] Appl. No.: 106,161

[22] Filed: Dec. 21, 1979

[30] Foreign Application Priority Data

Dec. 27, 1978 [DE] Fed. Rep. of Germany ....... 2856211

[51] Int. Cl.³ .......................... H03L 7/10; H03L 7/18
[52] U.S. Cl. ..................... 331/1 A; 331/16; 331/17; 331/27; 331/DIG. 2
[58] Field of Search ............. 331/1 A, 14, 16, 17, 331/18, 25, 27, DIG. 2

[56] References Cited

U.S. PATENT DOCUMENTS 3,164,777 1/1965 Guanella .......................... 331/18 X
4,030,045 6/1977 Clark ................................. 331/25 X
4,092,672 5/1978 Aschwanden ..................... 358/149

OTHER PUBLICATIONS

Geschwinde, "Einführung in die PLL-Technik" Vieweg, pp. 16-19, 38-41.

Primary Examiner—Siegfried H. Grimm
Attorney, Agent, or Firm—Spencer & Kaye

[57] ABSTRACT

A digital phase control circuit which includes a controllable oscillator, a programmable divider coupled to the oscillator, a reference frequency source, a phase discriminator coupled to the outputs of the programmable divider and reference frequency source and means coupling the output of the phase discriminator to a control input of the oscillator. In addition to these components, an auxiliary circuit is provided which has its input coupled to the output of the phase discriminator and first and second outputs coupled to the reference frequency source and the programmable divider. The auxiliary circuit generates a first signal at the input of the reference frequency source when the phase difference between the signals at the outputs of the programmable divider and the reference frequency source is in one direction and a second signal at the second input of the programmable divider when the phase difference is in the opposite direction.

5 Claims, 8 Drawing Figures

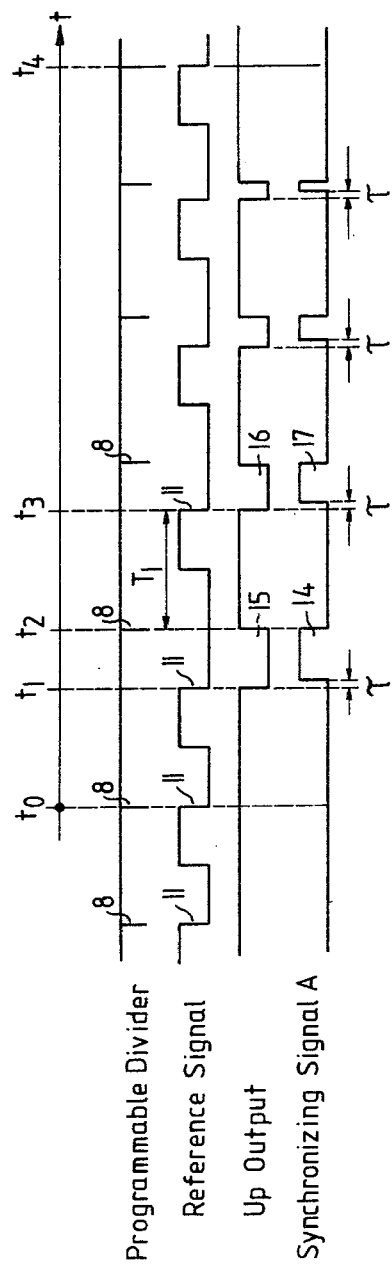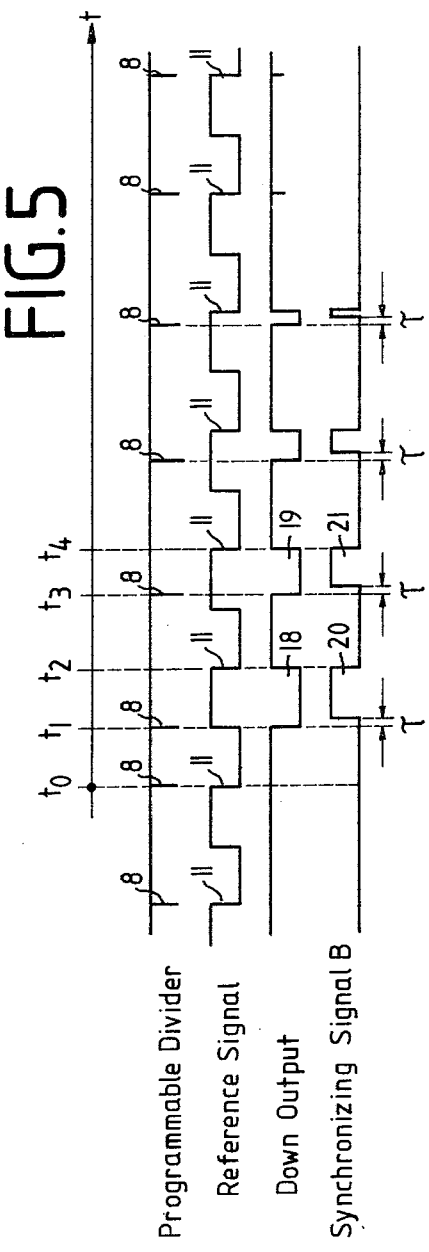

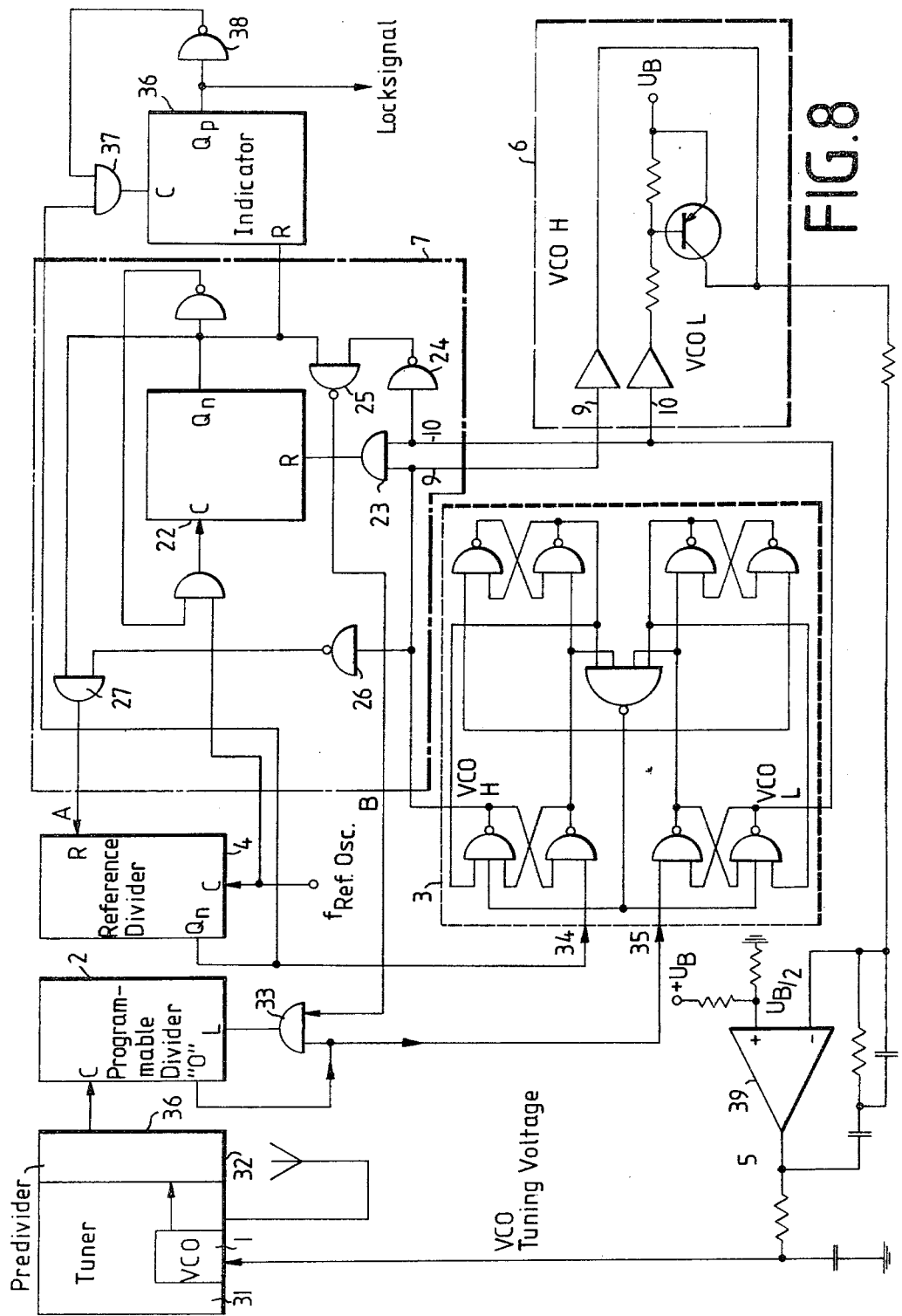

DIGITAL PHASE CONTROL CIRCUIT INCLUDING AN AUXILIARY CIRCUIT

BACKGROUND OF THE INVENTION

This invention relates to digital phase control circuits and, in particular, to a phase control circuit which has improved transient response during its readjustment mode.

Digital phase control circuits are known which include a controllable oscillator, a programmable divider, a reference frequency source, a phase discriminator and a lowpass filter or integrating circuit. The output signal of the controllable oscillator is fed to one input of the phase discriminator via the programmable divider and the other input of the phase discriminator receives a signal from the reference frequency source. The lowpass filter circuit derives a control signal from the output of the phase discriminator so as to control the controllable oscillator.

The signals at the output of the phase discriminator have rectangular pulses. The average d.c. voltage of the rectangular pulses is obtained by means of the series-connected filter circuit which provides a setting voltage for the controllable oscillator. The circuit regulates itself in such a way that, in the steady-state, the signals applied to the phase discriminator coincide in frequency and phase.

In order to prevent excessive overshoot of the controllable oscillator, a minimum time constant is required in the filter circuit which may be designed, for example, as an active integrator. This results in a relatively long time constant for the entire system which can be detrimental in many cases. A long time constant may also increase the tendency toward resonance of the entire circuit.

It is an object of the present invention to provide a phase control circuit which is substantially improved with respect to its transient response during readjustment.

SUMMARY OF THE INVENTION

The present invention comprises a digital phase control circuit which includes a controllable oscillator, a programmable divider coupled to the oscillator, a reference frequency source, a phase discriminator coupled to the outputs of the programmable divider and reference frequency source and means coupling the output of the phase discriminator to a control input of the oscillator. In addition to these components, an auxiliary circuit is provided which has its input coupled to the output of the phase discriminator and first and second outputs coupled to the reference frequency source and the programmable divider. The auxiliary circuit generates a first signal at the input of the reference frequency source when the phase difference between the signals at the outputs of the programmable divider and the reference frequency source are in one direction and a second signal at the second input of the programmable divider when the phase difference is in the opposite direction.

Thus, in the present invention, an auxiliary circuit is provided in addition to the components of the prior art phase control circuit. This auxiliary circuit acts selectively on the programmable divider or the reference frequency source to reset the programmable divider or the reference frequency source, respectively, to a predetermined initial phase position at specific points in time. This initiates a comparison which begins at the predetermined initial phase position of the circuit. The comparison process beginning with the return of the predetermined initial position of the programmable divider or of the reference frequency source is repeated continuously. The invention operates such that, during every comparison cycle, a genuine phase or frequency comparison is effected between the two signals present at the phase discriminator. Each time at the start of the comparison cycle, the phase difference is defined as "zero." Therefore, the phase of frequency deviation present at the end of the comparison cycle between the two signals present at the phase discriminator is an exact measure of the phase deviation.

BRIEF DESCRIPTION OF THE DRAWINGS

FIG. 4 is a pulse diagram of the signals in a phase control circuit including the features of the present invention for one direction of adjustment.

FIG. 5 shows signals corresponding to FIG. 4 for the other direction of adjustment.

FIG. 8 shows a television tuner constructed in accordance with the invention.

DESCRIPTION OF THE PREFERRED EMBODIMENTS

Figure 1:
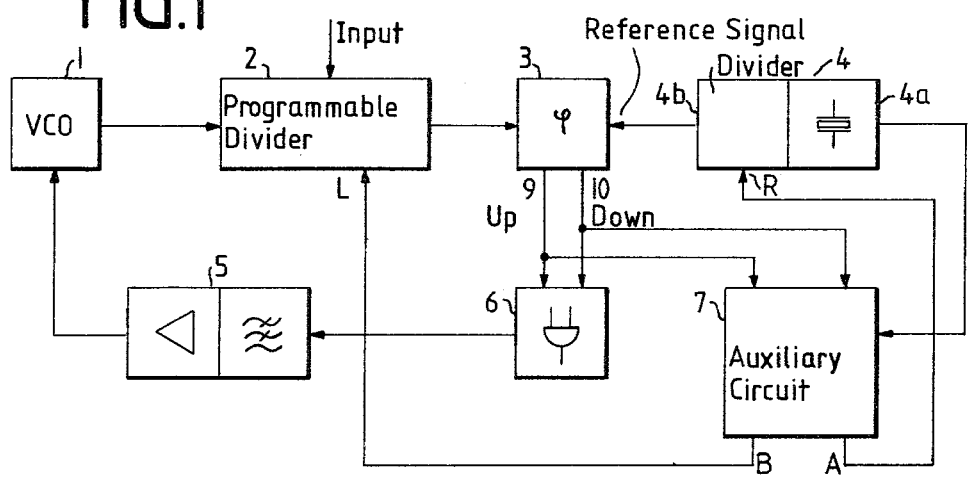
FIG. 1 shows a phase control circuit in accordance with the present invention.

FIG. 1 is a block diagram showing a phase adjustment circuit which includes a voltage controllable oscillator 1 (VCO), a programmable divider 2, a reference source 4, a phase discriminator 3, a coupling circuit 6 and a lowpass filter and amplifier circuit 5. These components are combined in a known manner to form a control loop. The programmable divider can be set to a selected dividing ratio which determines the initial frequency of the controllable oscillator 1. The programmable divider may also have fixed predividers (not shown) connected between it and the oscillator 1. The reference frequency source 4 includes a quartz oscillator 4a and a series-connected frequency divider 4b having, for example, a fixed dividing ratio. The output signal of the divider 4b is fed to the phase discriminator 3 to provide a reference signal.

Before describing auxiliary circuit 7 of FIG. 1, the operation of the prior art phase control circuit will be explained with the aid of FIGS. 2 and 3; that is, the circuit shown in FIG. 1 without the auxiliary circuit 7 will be described.

Figure 2:
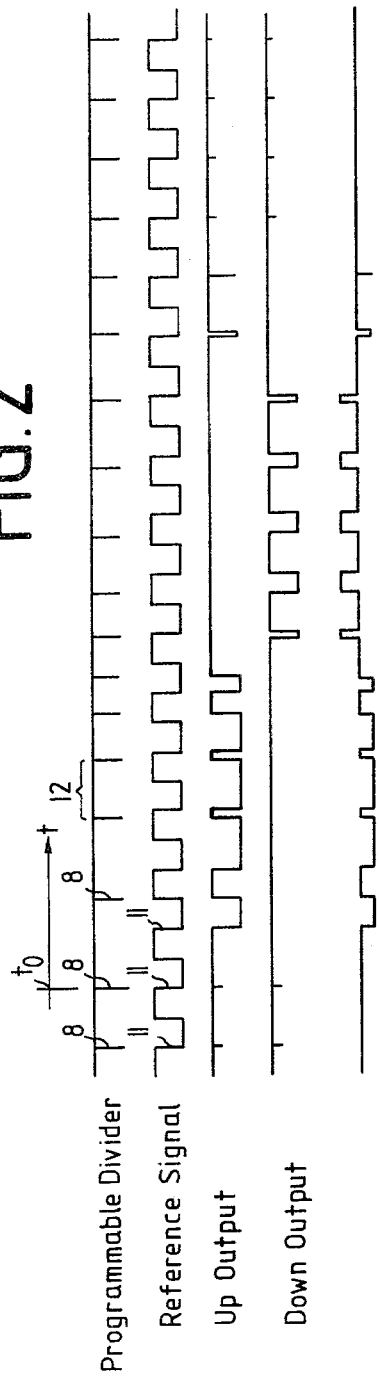
FIGS. 2 and 3 show the output signals of a prior art phase control circuit for both directions of adjustment.

The output signal of the programmable divider 2 is shown at the top of FIG. 2. After each passage through the programmable divider 2, a negative pulse 8 appears at the output of this divider and is fed to the phase discriminator 3. In the second line of FIG. 2, the reference signal is shown which is fed to the other input of the phase discriminator 3.

The phase discriminator 3 has an output 9 at which control pulses appear when the oscillator 1 is adjusted in the upward direction; that is, toward a higher frequency, and an output 10 at which pulses appear for an adjustment in the downward or lower frequency direction. The signals at outputs 9 and 10 are illustrated in the third and fourth lines of FIG. 2. The last line shows a so-called "tristate signal" which is obtained at the output of coupling circuit 6 and which is fed to the lowpass filter 5. The diagram shown in FIG. 2 is based on a so-called Type 4 phase discriminator which is described at page 19 of the book by Horst Geschwinde "Einführung in die PLL-Technik" (Introduction to the PLL Technique), published by Vieweg. Each of the outputs 9 and 10 of the phase discriminator 3 has an associated output in a bistable circuit comprising the phase discriminator. In the illustrated case, the phase discriminator 3 is designed so that the bistable circuits respond to the negative-going edge of the pulse 8 coming from the programmed divider 2. If there is a phase difference between the signals applied to the phase discriminator 3, pulses appear either at the "upward" output 9 or at the "downward" output 10, depending on the direction of the deviation. The bistable circuit associated with the "upward" output can be set by the edges 11 of the reference signal and reset by the pulses 8 coming from tne programmable divider 2. Conversely, the bistable circuit in the phase discriminator associated with the "downward" output can be set exactly oppositely by the pulses 8 coming from the programmable divider 2 and reset by the edges 11 of the reference signal.

FIG. 2 shows the signals for the case where at time $t_0$ the dividing ratio of the programmable divider 2 is switched to a higher value. Consequently, the frequency of the oscillator 1 is adjusted toward higher frequencies, which can be seen in FIG. 2 in that the pulses 8 at the output of the programmable divider jump toward a lower frequency after a new dividing ratio has been set into the programmable divider and thereafter are brought closer together by the adjustment process. Thus, at an interval indicated by the bracket 12, the frequency of the pulses coincides with the frequency of the reference signals but there still exists a phase deviation between the signals. This deviation can be overcome by temporarily increasing the frequency of the signal of oscillator 1 beyond the desired value. For that reason, the pulses at the "upward" output 9 continue to be generated. The prior art circuit thus exhibits an overshoot which is required by the system.

Figure 3:
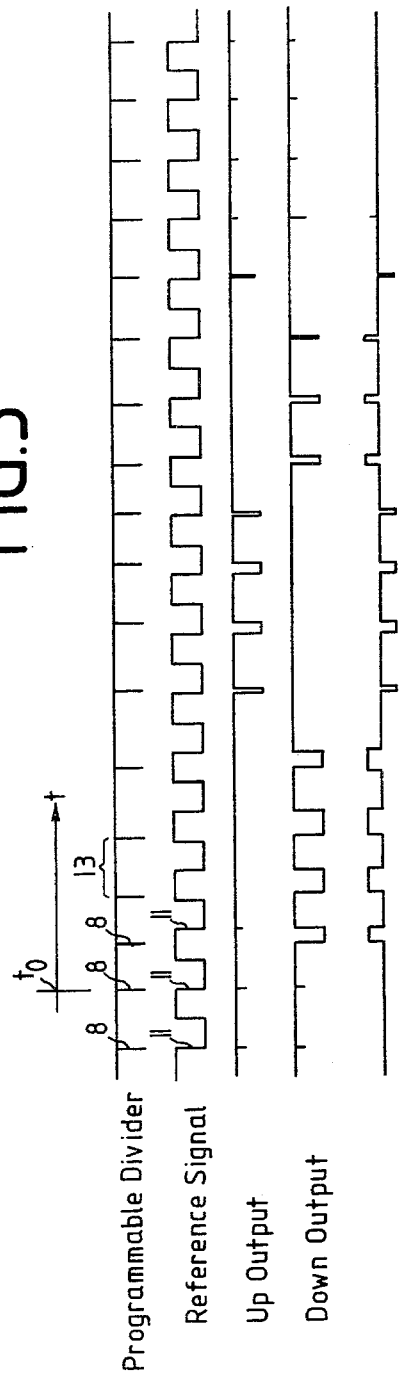

FIG. 3 is a pulse diagram in which the dividing ratio of the programmable divider 2 of FIG. 1 is set to a lower value at time $t_0$. The time at which coincidence with respect to frequency exists for the signals being compared in the phase discriminator is identified by a bracket 13. The operation of the prior art system under these conditions is analagous to the previously described operation under the conditions of FIG. 2.

The auxiliary circuit 7 of FIG. 1 resets the programmable divider 2 or the reference frequency source 4, to its initial position at specific points in time. The auxiliary circuit 7 is controlled by the signals at outputs 9 and 10 of the phase discriminator 3.

FIGS. 4 and 5 show how the auxiliary circuit of FIG. 1 controls the programmable divider 2 and the reference frequency source 4. FIG. 4 illustrates the operation of the circuit including auxiliary circuit 7 for a change in frequency corresponding to FIG. 2 wherein the oscillator frequency increases; that is, changes in the upward direction. It is assumed that the circuit has the same components as the circuits on which FIGS. 2 and 3 are based but that it includes in addition the auxiliary circuit 7.

The synchronizing signal A shown in the last line of FIG. 4 is generated by the auxiliary circuit 7. The synchronizing signal A includes pulses 14 and 17 which are fed to the reset input R of the reference frequency source. At time $t_0$, a new dividing ratio is fed into the programmable divider 2 and at time $t_1$ the oscillator begins to increase its frequency so that the pulses 8 come closer together again. At time $t_1$, the pulse 15 is initiated at the "upward" output 9 of the phase discriminator since the edge 11 of the reference signal appears earlier than the next pulse 8 from the programmable divider. The pulse 14 of the synchronizing signal A is derived from the pulse 15.

Pulse 14 is used initially to reset the divider 4b of the reference frequency source 4 which does not generate reference signal pulses as long as pulse 14 is present. At time $t_2$, the pulse 15 and the output pulse 14 derived from pulse 15 are terminated. Thus, at time $t_2$, the divider of the frequency source 4 is restarted from its basic position.

The frequency divider 4b may be a twelve bit divider consisting, for example, of two type CD4520 integrated circuits manufactured by RCA. This known divider is set to its basic position by a logical reset signal.

After a period $T_1$ of the reference signal, at time $t_3$, a new control pulse 16 starts at the output 9 of the phase discriminator 3 since the edge 11 again appears earlier than the next pulse 8 from the programmable divider. A synchronizing pulse 17 is again generated which sets back the divider 4b of the reference frequency source 4 and stops it.

The adjustment is effected in the above-described manner until at time $t_4$ the signals being compared in the phase discriminator 3 coincide with respect to frequency and phase. As can be seen from a comparison of FIG. 4 with FIG. 2, this state is attained much faster than in the circuit without the auxiliary circuit 7. The control pulse terminated each time at the end of the comparison cycle provides a precise indication of the frequency deviation of the two signals applied to the phase discriminator, which is not the case in FIGS. 2 and 3.

Upon a change in the frequency of the oscillator in the opposite direction (downward), a synchronizing signal B is generated in the auxiliary circuit 7, as shown in FIG. 5, from the signal at "downward" output 10 of phase discriminator 3. With this synchronizing signal, the programmable divider 2 is controlled rather than the reference source 4 as shown in FIG. 4.

At time $t_0$, as in FIG. 3, the dividing ratio of the programmable divider is reduced to correspond to the reduction in frequency of the oscillator 1. This initially effects an increase in the output frequency of the controllable oscillator. The synchronizing signal B is derived from the pulses 18 and 19 at the "downward" output 10 of the discriminator 3. This signal is fed to the load input L of the programmable divider 2. At time $t_1$ a pulse 8 from the programmable divider starts the pulse 18 at the output 10. The programmable divider is set by the synchronizing pulse 20 derived from pulse 18 and is kept in the initial position until time $t_2$. At time $t_2$, the edge 11 of the reference signal terminates the pulse 18. At the same time, the programmable divider begins to operate again. At $t_3$, the pulse 19 at the output 10 is started because the next pulse 8 appears earlier than the next negative-going edge 11 of the reference signal. The synchronizing pulse 21 derived from pulse 19 again sets the programmable divider 2 and holds it in its initial position. At time $t_4$ the programmable divider 2 is released again and the process continues.

The programmable divider 2 is a known component. For example, four type 74 LS169 integrated circuits manufactured by National Semiconductor may be used in series as a fourteen bit presettable down counter.

As is evident from the explanation of FIGS. 4 and 5, the reference frequency source 4 is controlled by the auxiliary circuit in one direction and the programmable divider 2, located between the oscillator 1 and the discriminator 3, in the other direction. The influenced circuit is controlled in accordance with the signals appearing at the output of the discriminator 3, which correspond to the phase or frequency error, so that at the beginning of each comparison cycle the phase error is assumed to be zero. In this way, adjustment of the circuit beyond the desired value is avoided. Thus, the described phase control circuit, including the auxiliary circuit 7, has very short transient periods.

FIGS. 4 and 5 show that the rising edge of the synchronizing signals A and B are shifted by the time $\tau$ with respect to the associated output signal of discriminator 3. By providing a predetermined delay period $\tau$, the auxiliary circuit 7 is made effective for only a certain minimum width of the pulses of the output signal from discriminator 3. If the pulses at outputs 9 and 10 of the discriminator 3 fall below this minimum width, no synchronizing signals A or B are generated any longer. The circuit then operates in the customary manner, as described in connection with FIGS. 2 and 3. The delay period is advantageously selected to be greater than one period of the frequency of the reference oscillator so that the auxiliary circuit will not respond to the nontransient state.

If such a delay period is provided, the control circuit will be brought into a state, by means of the auxiliary circuit 7 provided to avoid overshooting, in which the signals present at the phase discriminator coincide with respect to frequency as well as phase. Then the auxiliary circuit 7 is no longer effective.

Figure 6:
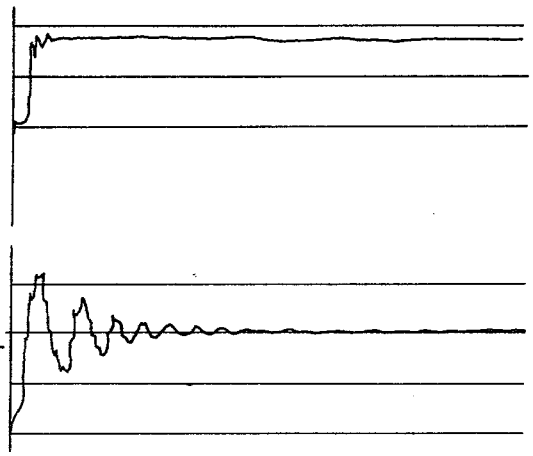
FIG. 6 is a waveform diagram comparing the operation of the circuit with and without the auxiliary circuit of FIG. 1.

FIG. 6 shows the result obtained with the auxiliary circuit 7 by illustrating the control signal for oscillator 1. The top portion of FIG. 6 shows the signal obtained when an auxiliary circuit was used which operates in the manner described above under conditions of increasing frequency. The signal at the bottom of FIG. 6 was obtained when the same circuit was used without auxiliary circuit 7. It can be seen that the auxiliary circuit 7 resulted in a significant improvement in the transient behavior.

Figure 7:
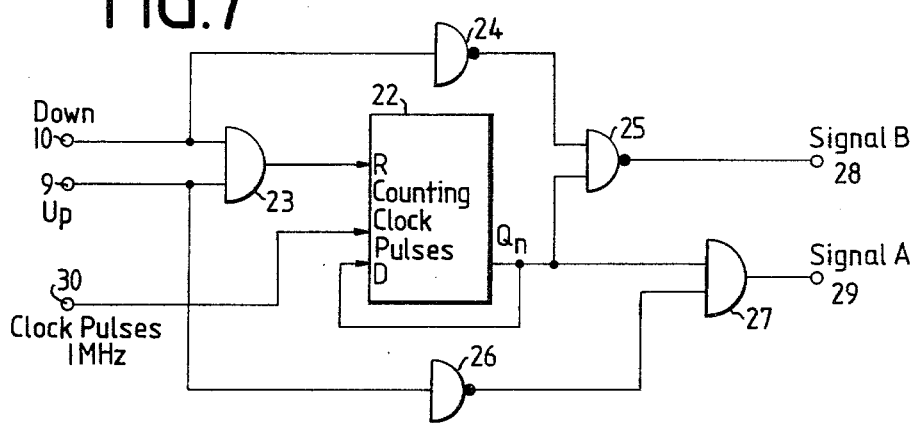
FIG. 7 shows an embodiment of the auxiliary circuit of FIG. 1.

FIG. 7 shows an embodiment of the auxiliary circuit 7 of FIG. 1. The auxiliary circuit includes a counter 22 and logic gates 23 to 27, the counter generating the fixed delay period $\lambda$. A typical counter which may be used for this purpose is the type CD4520 manufactured by RCA. The signals at the outputs 9 and 10 of the phase discriminator 3 are fed through an AND gate 23 to the reset input of the counter 22. The clock pulse input of the counter 22 receives, via an input terminal 30, counting pulses at a frequency of, for example, 1 MHz. If no pulse arrives from the outputs 9 and 10 of the phase discriminator, the reset input receives a reset signal and the clock pulses at the clock pulse input of the counter 22 are ineffective. The output $Q_n$ of the $n^{th}$ stage of the counter 22 is connected with a disable input D of the counter. That is, if the counter state $Q_n$ is reached, the counter stops itself. The synchronizing signals A and B are also derived from output $Q_n$ via gates 25 and 27. A signal is fed via inverters 24 and 26, to the gates 25 and 27 which act as gating circuits so as to indicate which one of the two gates 25 and 27 is to be enabled for the signal coming from output $Q_n$. Gates 25 and 27 therefore control whether the programmable divider 2 or the reference frequency source 4 of FIG. 1 receives a synchronizing signal.

With reference to FIGS. 4 and 5, the circuit in FIG. 7 operates as follows: The pulse 15 in FIG. 4 is present at the input 9 and enables gate 27 via inverter 26 to provide a synchronizing signal. However, no pulse appears at output 29 because the output $Q_n$ of the counter 22 does not furnish a signal. Pulse 15 cancels the reset signal of counter 22 and counting pulses from input 30 are counted into the counter. After a delay period $\lambda$ a signal jump appears at the output $Q_n$, in accordance with the clock pulse frequency and the number of stages in the counter, which stops the counter 22 through the disable input. The change of signals at the output $Q_n$ also changes the logic state at the upper input of gate 27 so that the pulse 14 of FIG. 4 is formed. As soon as pulse 15 in FIG. 4 is completed, the AND condition for gate 27 is no longer met so that the pulse 14 is terminated simultaneously with pulse 15. The termination of pulse 15 causes the counter 22 to be reset to its starting position and held in that position.

When there is a pulse at input 10 of the circuit of FIG. 7, the circuit operates in a corresponding manner with the difference that gate 25 is enabled instead of gate 27. In this case, the synchronizing signal B is formed at output 28 and used to control the programmable divider 2. By selecting the frequency of the counting clock pulse at the input 30 it is possible to preselect the delay period $\lambda$.

It is also possible to obtain the delay period $\lambda$ by means of circuit elements which operate in a different manner. For example, the delay of a plurality of series-connected gates (e.g., inverters) can be utilized.

FIG. 8 shows the complete circuit diagram of a tuner embodying the features of the present invention. At the top left of FIG. 1, block 31 is a tuner including the VCO 1. The signal from the VCO 1 travels through a predivider 32 included in the tuner to the programmable divider 2. At the beginning of a dividing cycle, the programmable divider is set to the preprogrammed value via a "load" input L and is then pulsed until it reaches the value zero. When it reaches the value zero, the load input receives a new charging pulse via a gate 33 with which the starting position of the programmable divider 2 is reset. The charging pulse of the programmable divider is fed to the input 35 of a phase discriminator 3 which is shown in dashed lines in FIG. 8. The other input 34 of the phase discriminator 3 receives a signal from the reference divider 4. The phase discriminator 3 which operates in a known manner, includes a plurality of gates.

At the lower right of FIG. 8, the coupling circuit 6 is shown. The auxiliary circuit 7 which has already been described in connection with FIG. 7 is shown in outline in FIG. 8. The synchronizing signal A is fed to the reset input of the reference divider 4 and the synchronizing signal B is fed to gate 33.

The auxiliary circuit 7 is also connected to a lock indicator which includes a counter 36, an AND gate 37 and an inverter 38. The counter 36 is set back with each synchronizing signal A and B via a reset input. Clock pulses at a relatively low frequency are fed to the clock pulse input of the counter 36 via an AND gate 37. These clock pulses are obtained from the output of the reference divider 4. From an output $Q_p$, a lock signal is derived. This lock signal appears only if no synchronizing signal appears for a relatively long period of time. The supply of clock pulses through gate 37 is blocked as soon as the lock signal appears because of the feedback of the lock signal via an inverter 38. The lock signal remains in effect until a new synchronizing signal is formed.

The lower left of FIG. 8 shows the filter circuit 5 which includes an operational amplifier 39.

It will be understood that the above description of the present invention is susceptible to various modifications, changes and adaptations, and the same are intended to be comprehended within the meaning and range of equivalents of the appended claims.

What is claimed is:

1. In a digital phase control circuit including a controllable oscillator having a control input; a programmable first divider having first and second inputs, said first input being coupled to the output of said oscillator; a reference frequency source comprising a second divider having an input; a phase discriminator having first and second inputs coupled to the outputs of said programmable first divider and said second divider respectively, said phase discriminator further having output means; and means coupling the output means of said phase discriminator to the control input of said controllable oscillator, the frequency of said oscillator being controlled in a direction determined by the direction of the phase deviation between the signals applied to the first and second inputs of said phase discriminator and compared therein; the improvement comprising:

an auxiliary circuit having input means coupled to the output means of said phase discriminator, a first output coupled to the input of said second divider comprising said reference frequency source and a second output coupled to the second input of said programmable first divider, said auxiliary circuit generating a first synchronizing signal at the input of said second divider when the phase difference between the signals at the outputs of said programmable first divider and said second divider is in one direction and generating a second synchronizing signal at the second input of said programmable first divider when the phase difference between the signals at the outputs of said programmable first divider and said second divider is in the opposite direction thereby setting either said programmable first divider or said second divider, respectively, to a predetermined initial phase position, the divider set to said predetermined initial phase position being maintained in said position until the other divider reaches its predetermined initial phase position.

2. The phase control circuit defined by claim 1 wherein said auxiliary circuit comprises a clock pulse generator for generating a signal at a predetermined interval after generation of a signal at the output of said phase discriminator, an auxiliary circuit output signal being generated at the input of said second divider or at the input of said programmable first divider only if the signal at the output of said phase discriminator is generated for an interval longer than said predetermined interval.

3. The phase control circuit defined by claim 2 wherein the output of said phase discriminator and the output of said auxiliary circuit each comprise a plurality of sequential pulses having a leading edge and a trailing edge, the leading edges of the pulses at the output of said auxiliary circuit occurring later than the leading edges of the corresponding pulses at the output of said phase discriminator, and the trailing edges of the corresponding pulses at both the output of the auxiliary circuit and the output of the phase discriminator coinciding.

4. The phase control circuit defined by claim 2 wherein said clock pulse generator receives counting pulses at a constant frequency, means are provided for releasing said clock pulse generator to count said counting pulses from its predetermined initial position when a signal is generated at the output of said phase discriminator and means are provided for coupling the signal at the output of said clock pulse generator to a disable input thereof to stop said counter.

5. A phase control circuit as defined by claim 4 wherein the output means of said phase discriminator comprises a first output at which pulses appear when the frequency of said oscillator is increasing and a second output at which pulses appear when the frequency of said oscillator is decreasing, and wherein said auxiliary circuit further includes a first gating circuit having first and second inputs coupled to the first and second outputs of said phase discriminator and an output coupled to a reset terminal of said clock pulse generator, second and third gating circuits for coupling the output of said clock pulse generator to the input of said second divider and to the second input of said programmable first divider, respectively, and fourth and fifth gating circuits coupling the first and second outputs of said phase discriminator to the inputs of said second and third gating circuits.

* * * * *